United States Patent
Xu et al.

(10) Patent No.: US 8,836,277 B2
(45) Date of Patent: Sep. 16, 2014

(54) BATTERY HEATING CIRCUITS AND METHODS USING RESONANCE COMPONENTS IN SERIES BASED ON CURRENT LIMITING AND VOLTAGE INVERSION WITH BI-DIRECTIONALITY AND COMMON INDUCTANCE

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 353 days.

(21) Appl. No.: 13/170,044

(22) Filed: Jun. 27, 2011

(65) Prior Publication Data

US 2012/0025779 A1 Feb. 2, 2012

(30) Foreign Application Priority Data

Jul. 30, 2010 (CN) .......................... 2010 1 0245288
Aug. 30, 2010 (CN) .......................... 2010 1 0274785
Mar. 31, 2011 (CN) .......................... 2011 1 0080853

(51) Int. Cl.
| | |
|---|---|
| H01M 10/46 | (2006.01) |
| H02J 7/00 | (2006.01) |
| H01M 10/6571 | (2014.01) |
| H01M 10/615 | (2014.01) |
| H01M 10/625 | (2014.01) |
| H01M 10/657 | (2014.01) |
| H02M 3/158 | (2006.01) |

(52) U.S. Cl.
CPC .......... *H01M 10/5083* (2013.01); *H02J 7/0014* (2013.01); *H01M 10/5006* (2013.01); *H01M 10/5016* (2013.01); *Y02T 10/7055* (2013.01); *H02M 3/158* (2013.01); *Y02E 60/12* (2013.01); *H01M 10/5081* (2013.01)

USPC ............................ 320/107; 320/128; 320/129

(58) Field of Classification Search
USPC .......................................................... 320/129
See application file for complete search history.

(56) References Cited

U.S. PATENT DOCUMENTS

| | | | |
|---|---|---|---|
| 3,654,426 A | 4/1972 | Brinkmann et al. | |
| 3,808,481 A | 4/1974 | Rippel | |

(Continued)

FOREIGN PATENT DOCUMENTS

| | | | |
|---|---|---|---|
| CN | 1630129 A | 6/2005 | |
| CN | 1630130 A | 6/2005 | |

(Continued)

OTHER PUBLICATIONS

Taiwan Intellectual Property Office, Office Action dated Jan. 10, 2014, in related application TW 100143128.

(Continued)

*Primary Examiner* — Samuel Berhanu
*Assistant Examiner* — Jerry D Robbins
(74) *Attorney, Agent, or Firm* — Jones Day

(57) ABSTRACT

Circuit and method for heating a battery. The circuit includes the battery including parasitic damping and current storage components. A first switch unit and first charge storage component are parts of a battery discharging circuit. A second current storage component is in series with the first charge storage component and a one-way semiconductor component. The one-way semiconductor component and second current storage component are in parallel with the first switch unit. The first charge storage component, second current storage component, and the one-way semiconductor component are parts of a battery charging circuit. A second switch unit is in parallel to the first charge storage component and the second current storage component. The second switch unit and the second current storage component are parts of a voltage regulation and polarity inversion circuit for the first charge storage component. The circuit heats the battery by discharging and charging the battery.

20 Claims, 7 Drawing Sheets

(56) References Cited

U.S. PATENT DOCUMENTS

| | | | |
|---|---|---|---|
| 4,171,508 A | 10/1979 | Sinclair | |
| 4,184,197 A | 1/1980 | Cuk et al. | |
| 4,222,000 A | 9/1980 | Silvertown et al. | |
| 5,362,942 A | 11/1994 | Vanderslice, Jr. et al. | |
| 5,396,165 A * | 3/1995 | Hwang et al. | 323/210 |
| 5,461,556 A | 10/1995 | Horie et al. | |
| 5,768,114 A | 6/1998 | Gruning et al. | |
| 5,789,905 A | 8/1998 | Yamasaki | |
| 5,808,469 A | 9/1998 | Kopera | |
| 5,905,371 A | 5/1999 | Limpaecher | |
| 5,943,224 A | 8/1999 | Mao | |
| 5,948,298 A | 9/1999 | Ijaz | |
| 5,990,661 A | 11/1999 | Ashtiani et al. | |
| 6,002,240 A | 12/1999 | McMahan et al. | |
| 6,072,301 A * | 6/2000 | Ashtiani et al. | 320/128 |
| 6,078,163 A | 6/2000 | Horie et al. | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 | 8/2004 | Orr et al. | |
| 6,882,061 B1 * | 4/2005 | Ashtiani et al. | 307/10.7 |
| 7,292,010 B2 | 11/2007 | Hsu et al. | |
| 7,382,102 B2 * | 6/2008 | Ashtiani | 318/139 |
| 7,402,982 B2 | 7/2008 | Ito et al. | |
| 7,876,583 B2 | 1/2011 | Polivka et al. | |
| 8,004,866 B2 | 8/2011 | Bucella et al. | |
| 8,197,502 B2 | 6/2012 | Smith et al. | |
| 8,493,036 B2 | 7/2013 | Ferrario | |
| 2005/0077879 A1 | 4/2005 | Near | |
| 2005/0156578 A1 | 7/2005 | Kamenoff | |
| 2005/0168195 A1 | 8/2005 | MacDougall | |
| 2005/0264237 A1 | 12/2005 | Ishizuka | |
| 2007/0024243 A1 | 2/2007 | Liu et al. | |
| 2007/0121258 A1 | 5/2007 | Hachiya | |
| 2009/0014436 A1 | 1/2009 | Toya et al. | |
| 2009/0243547 A1 | 10/2009 | Andelfinger | |
| 2011/0095711 A1 | 4/2011 | Hsieh et al. | |
| 2011/0144861 A1 * | 6/2011 | Lakirovich et al. | 701/36 |
| 2011/0273136 A1 | 11/2011 | Yoshimoto | |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025756 A1 | 2/2012 | Xu et al. | |
| 2012/0025772 A1 | 2/2012 | Xu et al. | |
| 2012/0025774 A1 | 2/2012 | Xu et al. | |
| 2012/0025775 A1 | 2/2012 | Xu et al. | |
| 2012/0025776 A1 | 2/2012 | Xu et al. | |
| 2012/0025777 A1 | 2/2012 | Xu et al. | |
| 2012/0025778 A1 | 2/2012 | Xu et al. | |
| 2012/0025780 A1 | 2/2012 | Xu et al. | |
| 2012/0025781 A1 | 2/2012 | Xu et al. | |
| 2012/0025782 A1 | 2/2012 | Xu et al. | |
| 2012/0025783 A1 | 2/2012 | Xu et al. | |
| 2012/0031890 A1 | 2/2012 | Han et al. | |
| 2012/0032642 A1 | 2/2012 | Xu et al. | |
| 2012/0126753 A1 | 5/2012 | Carkner | |
| 2012/0161711 A1 | 6/2012 | Xu et al. | |
| 2012/0279951 A1 | 11/2012 | Xu et al. | |
| 2012/0280658 A1 | 11/2012 | Xu et al. | |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Notice of Allowance mailed Dec. 5, 2013, in related U.S. Appl. No. 13/166,281.
United States Patent and Trademark Office, Notice of Allowance mailed Nov. 8, 2013, in related U.S. Appl. No. 13/166,301.
United States Patent and Trademark Office, Notice of Allowance mailed Jan. 6, 2014, in related U.S. Appl. No. 13/189,096.
United States Patent and Trademark Office, Notice of Allowance mailed Jan. 6, 2014, in related U.S. Appl. No. 13/187,874.
United States Patent and Trademark Office, Office Action mailed Nov. 20, 2013, in related U.S. Appl. No. 13/168,004.
United States Patent and Trademark Office, Office Action mailed Nov. 22, 2013, in related U.S. Appl. No. 13/168,014.
United States Patent and Trademark Office, Final Office Action mailed Feb. 25, 2014, in related U.S. Appl. No. 13/170,021.
United States Patent and Trademark Office, Office Action mailed Jan. 6, 2014, in related U.S. Appl. No. 13/187,266.
United States Patent and Trademark Office, Office Action mailed Jan. 3, 2014, in related U.S. Appl. No. 13/184,906.

(56) References Cited

OTHER PUBLICATIONS

United States Patent and Trademark Office, Office Action mailed Jan. 2, 2014, in related U.S. Appl. No. 13/189,114.
United States Patent and Trademark Office, Office Action mailed Dec. 3, 2013, in related U.S. Appl. No. 13/187,279.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Jan. 15, 2014, in related U.S. Appl. No. 13/749,480.
European Patent Office, Extended European Search Report dated Sep. 13, 2011, in related application EP 11166955.2.
European Patent Office, Extended European Search Report dated Nov. 30, 2011, in related application EP 11166938.8.
European Patent Office, Extended European Search Report dated Dec. 15, 2011, in related application EP 11166941.2.
European Patent Office, Extended European Search Report dated Sep. 16, 2011, in related application EP 11166949.5.
European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 31, 2013, in related U.S. Appl. No. 13/168,004.
United States Patent and Trademark Office, Office Action mailed May 22, 2013, in related U.S. Appl. No. 13/168,014.
United States Patent and Trademark Office, Office Action mailed Jul. 5, 2013, in related U.S. Appl. No. 13/170,021.
United States Patent and Trademark Office, Office Action mailed Jul. 30, 2013, in related U.S. Appl. No. 13/166,301.
United States Patent and Trademark Office, Office Action mailed Sep. 5, 2013, in related U.S. Appl. No. 13/189,096.
United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Jun. 19, 2013, in related U.S. Appl. No. 13/187,890.
United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.
United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13/187,266.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 24, 2014, in related U.S. Appl. No. 13/187,279.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.

(56) References Cited

OTHER PUBLICATIONS

United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed Jun. 18, 2014, in related U.S. Appl. No. 13/189,096.
United States Patent and Trademark Office, Notice of Allowance mailed May 8, 2014, in related U.S. Appl. No. 13/187,874.
United States Patent and Trademark Office, Notice of Allowance mailed Apr. 28, 2014, in related U.S. Appl. No. 13/189,114.

\* cited by examiner

US 8,836,277 B2

BATTERY HEATING CIRCUITS AND METHODS USING RESONANCE COMPONENTS IN SERIES BASED ON CURRENT LIMITING AND VOLTAGE INVERSION WITH BI-DIRECTIONALITY AND COMMON INDUCTANCE

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201110080853.7, filed Mar. 31, 2011, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

One embodiment of the present invention provides a battery heating circuit, wherein: a battery E, a damping component R1, a current storage component L1, a switch unit DK1 and a charge storage component C1 are connected in series to form a battery discharging circuit; a current storage component L2 is connected with a one-way semiconductor component D3 in series, and then the series circuit composed of the current storage component L2 and the one-way semiconductor component D3 is connected in parallel to the ends of the switch unit DK1; the charge storage component C1, the current storage component L2, and the one-way semiconductor component D3 are connected in series in sequence to form a battery back-charging circuit; and a switch unit DK2 is connected in parallel to the ends of the serially connected charge storage component C1 and current storage component L2, and works together with the current storage component L2 to form a voltage regulation and polarity inversion circuit for the charge storage component C1.

According to some embodiments of the present invention, since the battery back-charging circuit and the voltage regulation and polarity inversion circuit share the same current storage component L2, and therefore the number of needed components is decreased. In addition, for example, by controlling the switch unit DK2 in the voltage regulation and polarity inversion circuit, the remaining energy in the charge storage component C1 can be further charged back into the battery E after the battery back-charging circuit charges back the electric energy stored in the charge storage component C1 partially to the battery E, and thereby the voltage across the charge storage component C1 can be regulated flexibly.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
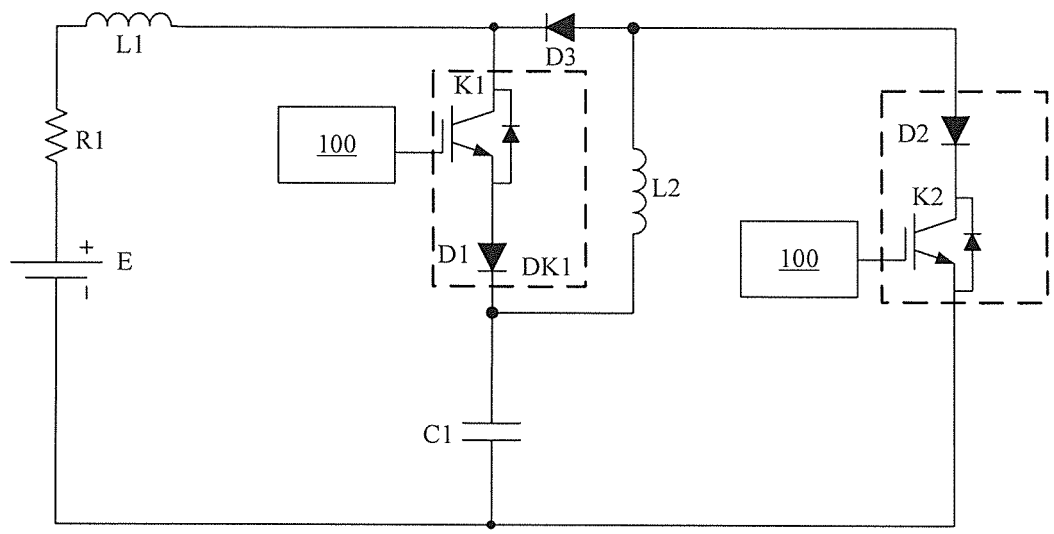
FIG. 1 is a schematic diagram of a battery heating circuit according to a first embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

FIG. 1 is a schematic diagram of a battery heating circuit according to a first embodiment of the present invention. As shown in FIG. 1, for example, the present invention provides a battery heating circuit, wherein: a battery E, a damping component R1, a current storage component L1, a switch unit DK1 and a charge storage component C1 are connected in series to form a battery discharging circuit; a current storage component L2 is connected with a one-way semiconductor component D3 in series, and then the series circuit composed of the current storage component L2 and the one-way semiconductor component D3 is connected in parallel to the ends of the switch unit DK1; the charge storage component C1, the current storage component L2 and the one-way semiconductor component D3 are connected in series in sequence to form a battery back-charging circuit; and a switch unit DK2 is connected in parallel to the ends of the serially connected charge storage component C1 and current storage component L2, and works together with the current storage component L2 to form a voltage regulation and polarity inversion circuit for the charge storage component C1.

Wherein: in one embodiment, the damping component R1 and the current storage component L1 can be the parasitic resistance and the parasitic inductance in the battery E respectively. For example, the switch unit DK1 can comprise a switching component K1 and a one-way semiconductor component D1 connected in series with each other, and the switch unit DK2 can comprise a switching component K2 and a one-way semiconductor component D2 connected in series with each other. In another example, the present invention is not limited to these components, and other components that can achieve one-way conduction function are also applicable.

Wherein: in another embodiment, the heating circuit further comprises a switching control module 100, which is electrically connected with the switch unit DK1 and the switch unit DK2, and is configured to: control the switch unit DK1 to switch on and control the switch unit DK2 to switch off, so that the electric energy in the battery E can be charged into the charge storage component C1; in the process that the electric energy in the battery E is charged into the charge storage component C1, when the current flowing through the battery E reaches zero after the positive half cycle, control the switch unit DK1 to switch off, so that the electric energy stored in the charge storage component C1 can be charged back into the battery E; in the process that the electric energy stored in the charge storage component C1 is charged back to the battery E, when the current flowing through the battery E reaches zero after the negative half cycle, control the switch unit DK2 to switch on, so that the electric energy stored in the charge storage component C1 can be charged into the current storage component L2 and then charged back from the current storage component L2 to the charge storage component C1; and, when the current flowing through the voltage regulation and polarity inversion circuit reaches zero after the positive half cycle, control the switch unit DK2 to switch off, so that the polarity of the charge storage component C1 is inverted. In that process, for example, by keeping the back-and-forth flow of electric energy between the battery E, charge storage component C1, and the current storage component L2, current flowing through the battery E is maintained, so that the battery E is heated up by itself.

Figure 2:
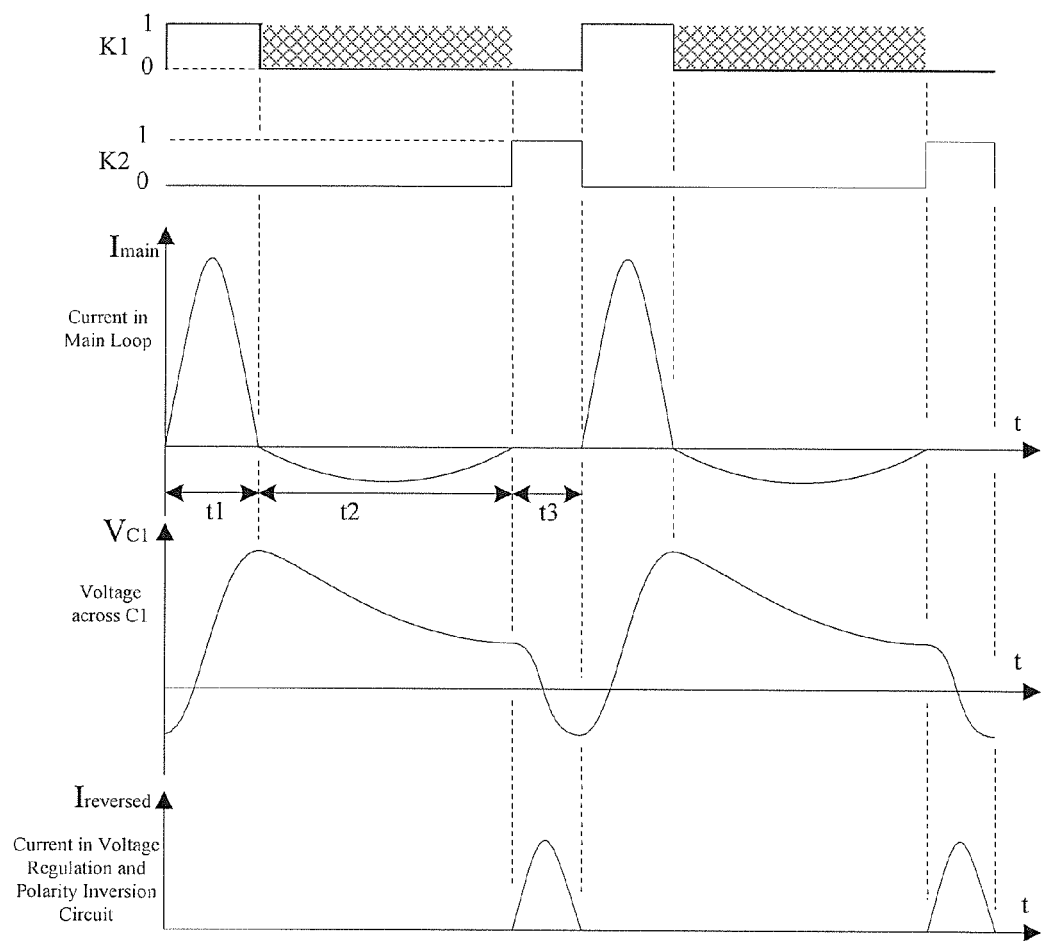
FIG. 2 is a timing diagram of waveforms of the battery heating circuit as shown in FIG. 1 according to one embodiment of the present invention.

FIG. 2 is a timing diagram of waveforms of the battery heating circuit as shown in FIG. 1 according to one embodiment of the present invention. As shown below, in one embodiment, the control exercised by the switching control module 100 is described with reference to FIG. 2, wherein: the current $I_{main}$ in the main loop represents the current flowing through the battery E, $V_{C1}$ represents the voltage across the charge storage component C1, the current $I_{reversed}$ represents the current flowing through the voltage regulation and polarity inversion circuit, i.e., the current flowing through the switch unit DK2. For example, first, the switching control module 100 controls the switch unit DK1 to switch on, and controls the switch unit DK2 to switch off, so that the electric energy in the battery E can be charged into the charge storage component C1 (see the time period $t_1$ in FIG. 2); next, when the current flowing through the battery E reaches zero after the positive half cycle, the switching control module 100 controls the switch unit DK1 to switch off, so that the electric energy stored in the charge storage component C1 can be charged back to the battery E (see the time period $t_2$ in FIG. 2); then, when the current flowing through the battery E reaches zero after the negative half cycle (at this point, the voltage across the charge storage component C1 is equal to the voltage across the battery E, and therefore the remaining electric energy stored in the charge storage component C1 cannot be charged back into the battery E any more), the switching control module 100 controls the switch unit DK2 to switch on, so that the remaining electric energy stored in the charge storage component C1 can be charged into the current storage component L2, and then charged back from the current storage component L2 to the charge storage component C1 (see the time period $t_3$ in FIG. 2); when the current flowing through the voltage regulation and polarity inversion circuit reaches zero after the positive half cycle, it indicates the polarity inversion of charge storage component C1 has been accomplished; at that point, the switching control module 100 controls the switch unit DK2 to switch off. In another example, then, the switching control module 100 can control the switch unit DK1 to switch on, to repeat the cycle described above. Thereby, the current flowing through the battery E is maintained, so that the battery is heated up according to one embodiment.

According to another embodiment, preferably, the switching control module 100 is also configured to: when the current flowing through the voltage regulation and polarity inversion circuit reaches a first preset value of current, control the switch unit DK2 to switch off, so that the electric energy stored in the current storage component L2 can be sustained and transferred to the battery E; and, step c2): when the current flowing through the voltage regulation and polarity inversion circuit reaches a second preset value of current, control the switch unit DK2 to switch on, so that the electric energy stored in the charge storage component C1 can be charged into the current storage component L2; the second preset value of current is smaller than the first preset value of current. For example, the above cycle is repeated, till the voltage across the charge storage component C1 reaches the preset value of voltage. In another example, in that way, the voltage across the charge storage component C1 can be controlled flexibly, and can reach a voltage value below the voltage of the battery E. In yet another example, the first preset value of current can also be used to control the freewheeling current flowing through the battery E in step c2), to prevent over-current in the back-charging process to the battery E and thereby prevent damage to the battery.

Figure 3:
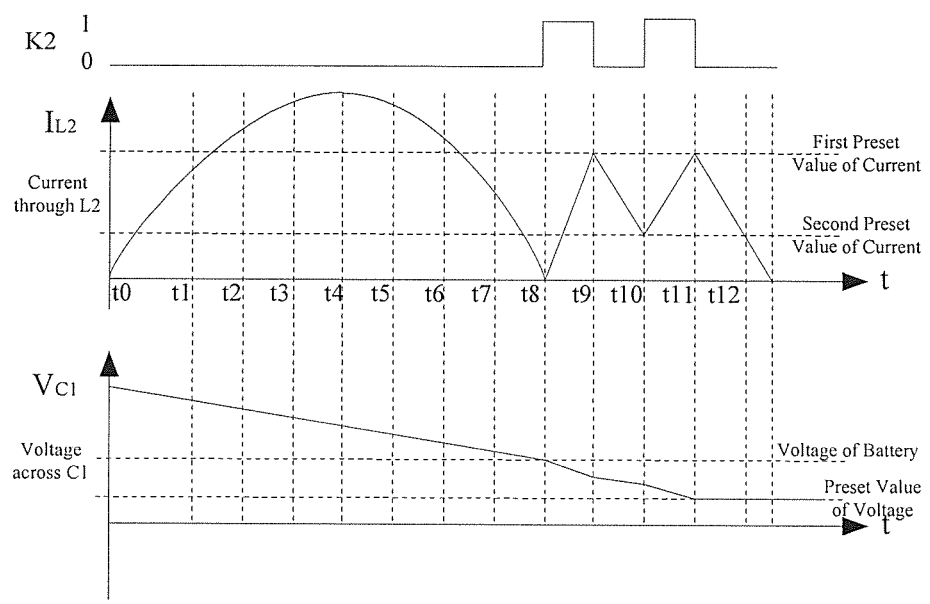
FIG. 3 is another timing diagram of waveforms of the battery heating circuit as shown in FIG. 1 according to another embodiment of the present invention.

FIG. 3 is another timing diagram of waveforms of the battery heating circuit as shown in FIG. 1 according to another embodiment of the present invention, wherein: the current $I_{L2}$ represents the current flowing through the current storage component L2, and the voltage $V_{C1}$ represents the voltage across the charge storage component C1. As shown in FIG. 3, for example, the time period t0-t8 indicates the back-charging process of the electric energy in the charge storage component C1 to the battery E through the battery back-charging circuit; at the end of that process, the voltage across the charge storage component C1 is equal to the voltage across the battery E, and therefore the energy in the charge storage component C1 cannot be charged back to the battery E any more at this point. In another example, then, the switching control module 100 controls the switch unit DK2 to switch on, and thus the electric energy stored in the charge storage component C1 is transferred through the voltage regulation and polarity inversion circuit into the current storage component L2 (see the time period t8-t9 in FIG. 3); when the current flowing through the voltage regulation and polarity inversion circuit (e.g., $I_{L2}$) reaches the first preset value of current, the switching control module 100 controls the switch unit DK2 to switch off, so that the electric energy stored in the current storage component L2 is transferred to the battery E (see the time period t9-t10 in FIG. 3). In yet another example, after that, when the current flowing through the voltage regulation and polarity inversion circuit (e.g., $I_{L2}$) reaches the second preset value of current, the switching control module 100 controls the switch unit DK2 to switch on, so that the electric energy stored in the charge storage component C1 can be further charged to the current storage component L2 (see the time period t10-t11 in FIG. 3). In yet another example, the above cycle is repeated, so that the voltage across the charge storage component C1 is decreased continuously, and finally reaches the expected voltage. Please note: for the sake of convenience, in FIG. 3 and FIG. 5 as shown below, the current flowing through the battery back-charging circuit and the current flowing through the voltage regulation and polarity inversion circuit are represented by the current flowing through the current storage component L2 according to some embodiments.

Figure 4:
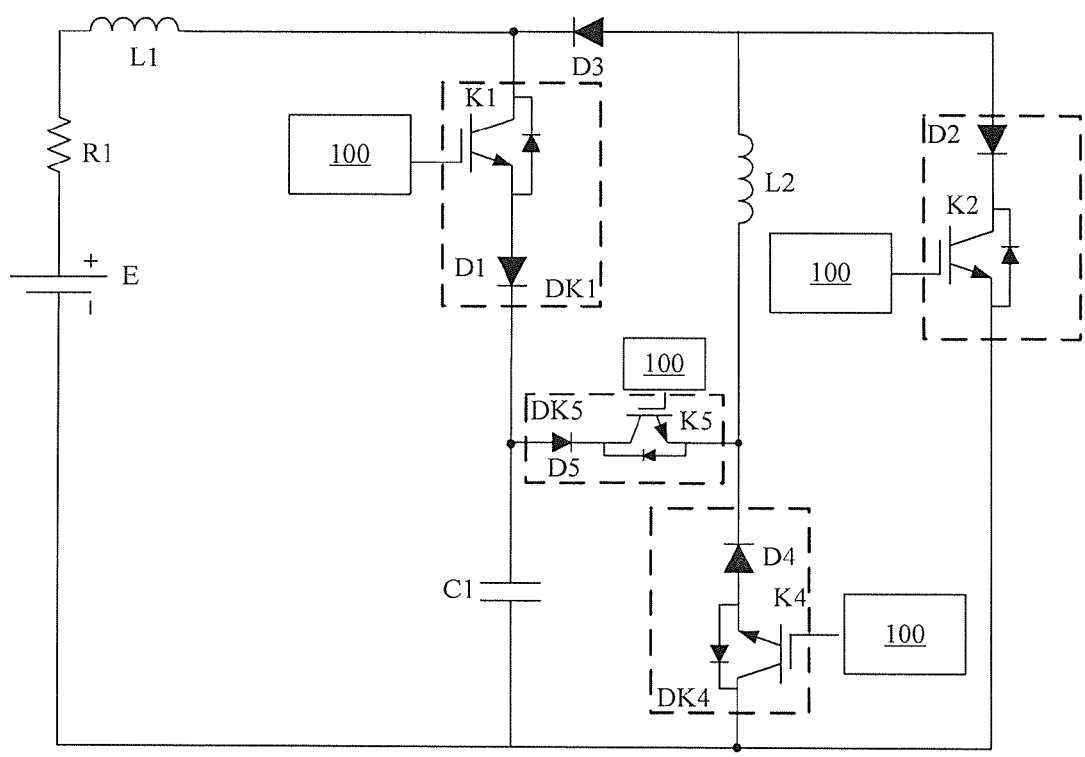
FIG. 4 is a schematic diagram of a battery heating circuit in a second embodiment of the present invention.

FIG. 4 is a schematic diagram of a battery heating circuit in a second embodiment of the present invention. As shown in FIG. 4, for example, the heating circuit also includes a switch unit DK4 and a switch unit DK5, wherein: the switch unit DK5 is in the path from the charge storage component C1 to the current storage component L2, and the switch unit DK4 is connected in parallel to the ends of the charge storage component C1 for current freewheeling. When the current flowing through the battery back-charging circuit reaches the first preset value of current, the switch unit DK5 can be controlled to switch off and the switch unit DK4 can be controlled to switch on, so that the back-charging current in the main loop can be decreased, and therefore damage to the battery E due to over-current in the main loop can be prevented, and the electric energy stored in the current storage component L2 can flow to the battery E. In another example, when the current flowing through the battery back-charging circuit is decreased to the second preset value of current, the switch unit DK4 can be controlled to switch off and the switch unit DK5 can be controlled to switch on, so that the electric energy stored in the charge storage component C1 can be charged back again to the battery E via the current storage component L2. In yet another example, the above cycle is repeated, till the voltage across the charge storage component C1 is lower than or equal to the voltage of the battery E.

The heating circuit of the second embodiment of the present invention can include the switching control module 100, which is electrically connected with the switch unit DK4 and the switch unit DK5, and is configured to perform the following operations: when the current flowing through the battery back-charging circuit reaches the first preset value of current, the switching control module 100 controls the switch unit DK5 to switch off and controls the switch unit DK4 to switch on, so that the electric energy stored in the current storage component L2 can flows to the battery E; and, when the current flowing through the battery back-charging circuit reaches the second preset value of current, the switching control module 100 controls the switch unit DK4 to switch off and controls the switch unit DK5 to switch on, so that the electric energy stored in the charge storage component C1 can be further charged back to the battery E via the current storage component L2. For example, the above cycle is repeated, till the voltage across the charge storage component C1 is lower than or equal to the voltage of the battery E.

Figure 5:
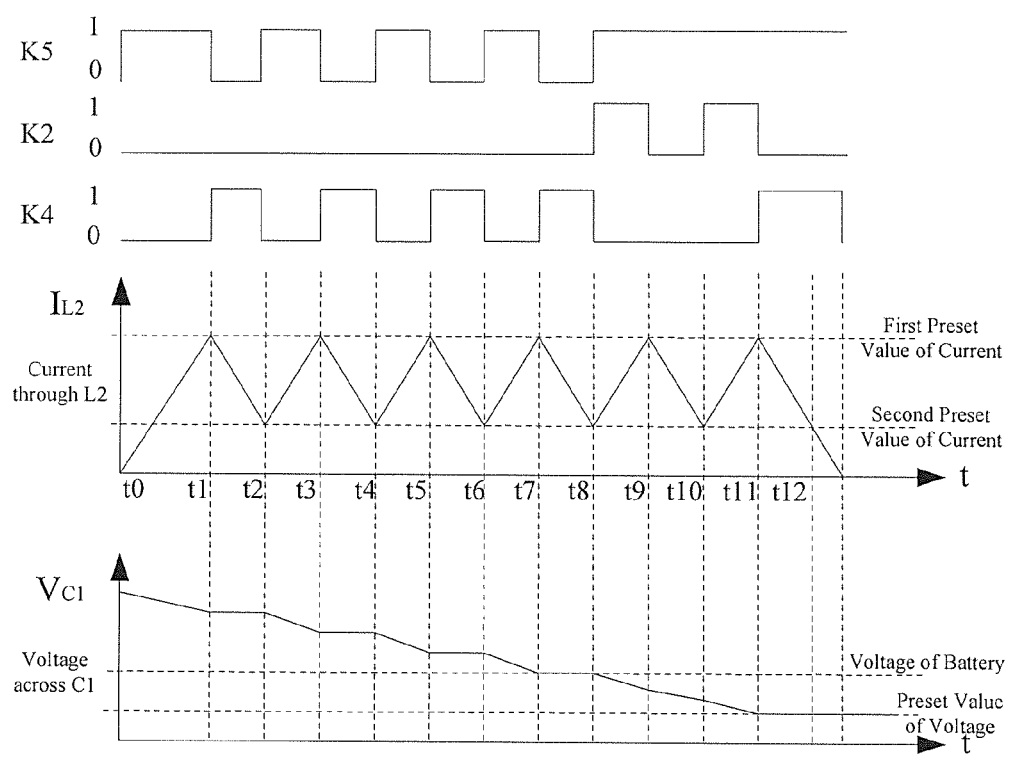
FIG. 5 is a timing diagram of waveforms of the battery heating circuit as shown in FIG. 4 according to one embodiment of the present invention.

FIG. 5 is a timing diagram of waveforms of the battery heating circuit as shown in FIG. 4 according to one embodiment of the present invention, wherein: the current $I_{L2}$ represents the current flowing through the current storage component L2, and the voltage $V_{C1}$ represents the voltage across the charge storage component C1. In one embodiment, as shown in the time period t0-t8 of FIG. 5, when the current flowing through the battery back-charging circuit reaches the first preset value of current, the switching control module 100 controls the switch unit DK5 to switch off and controls the switch unit DK4 to switch on, so that the electric energy stored in the current storage component L2 can flow to battery E via the switch unit DK4 (see the time periods t1-t2, t3-t4, t5-t6, and t7-t8 in FIG. 5); and, when the current flowing through the battery back-charging circuit reaches the second preset value of current, the switching control module 100 controls the switch unit DK4 to switch off and controls the switch unit DK5 to switch on, so that the electric energy stored in the charge storage component C1 can be charged to the battery E via the current storage component L2 (see the time periods t2-t3, t4-t5, and t6-t7 in FIG. 5). Here, for example, with the current freewheeling function of the switch unit DK4, the back-charging current to the battery E is controlled to be lower than the first preset value of current, and therefore damage to the battery E caused by high back-charging current can be prevented.

Figure 6:
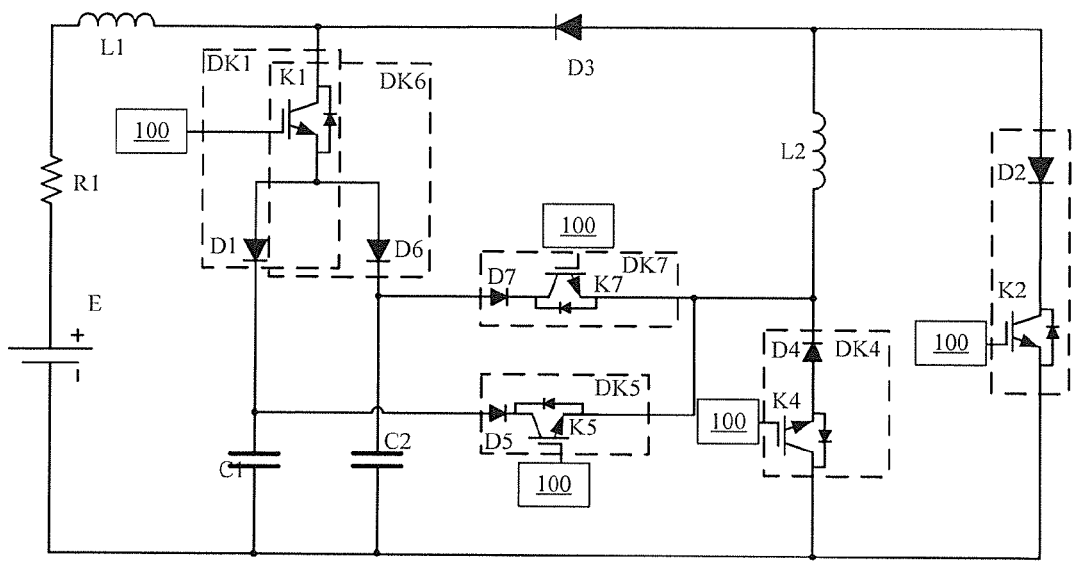
FIG. 6 is a schematic diagram of a battery heating circuit in a third embodiment of the present invention.

FIG. 6 is a schematic diagram of a battery heating circuit in a third embodiment of the present invention. For example, the heating circuit can also include one or more charge storage components C2, and switch units DK6 and DK7 that correspond to each charge storage component C2, wherein the battery E, the damping component R1, the current storage component L1, the switch unit DK6 and the charge storage component C2 are connected in series to form another battery discharging circuit; and the serially connected current storage component L2 and the one-way semiconductor component D3 are connected in parallel to the ends of the switch unit DK6, so that the charge storage component C2, the current storage component L2 and the one-way semiconductor component D3 connected serially in sequence form another battery back-charging circuit, and the switch unit DK7 is in the path from the charge storage component C2 to the current storage component L2. In another example, here, the one or more charge storage components C2 are used in a configuration similar to the charge storage component C1, and the charge storage components C1 and C2 can charge back the energy stored in them to the battery E via the current storage component L2 in different time periods, so that the energy load on the current storage component L2 is decreased, and therefore a current storage component L2 with lower capacity is enough to match the battery heating circuit.

Wherein: the battery heating circuit in the third embodiment of the present invention further includes the switching control module 100, which is electrically connected with the switch unit DK1, the switch unit DK2, the switch unit DK4, the switch unit DK5, the switch unit DK6 and the switch unit DK7, and is configured to control ON/OFF of the switch unit DK1, the switch unit DK2, the switch unit DK4, the switch unit DK5, the switch unit DK6 and the switch unit DK7, so that the charge storage components C2 and C1 are charged at the same time, but undergo discharge and polarity inversion at different times.

Figure 7:
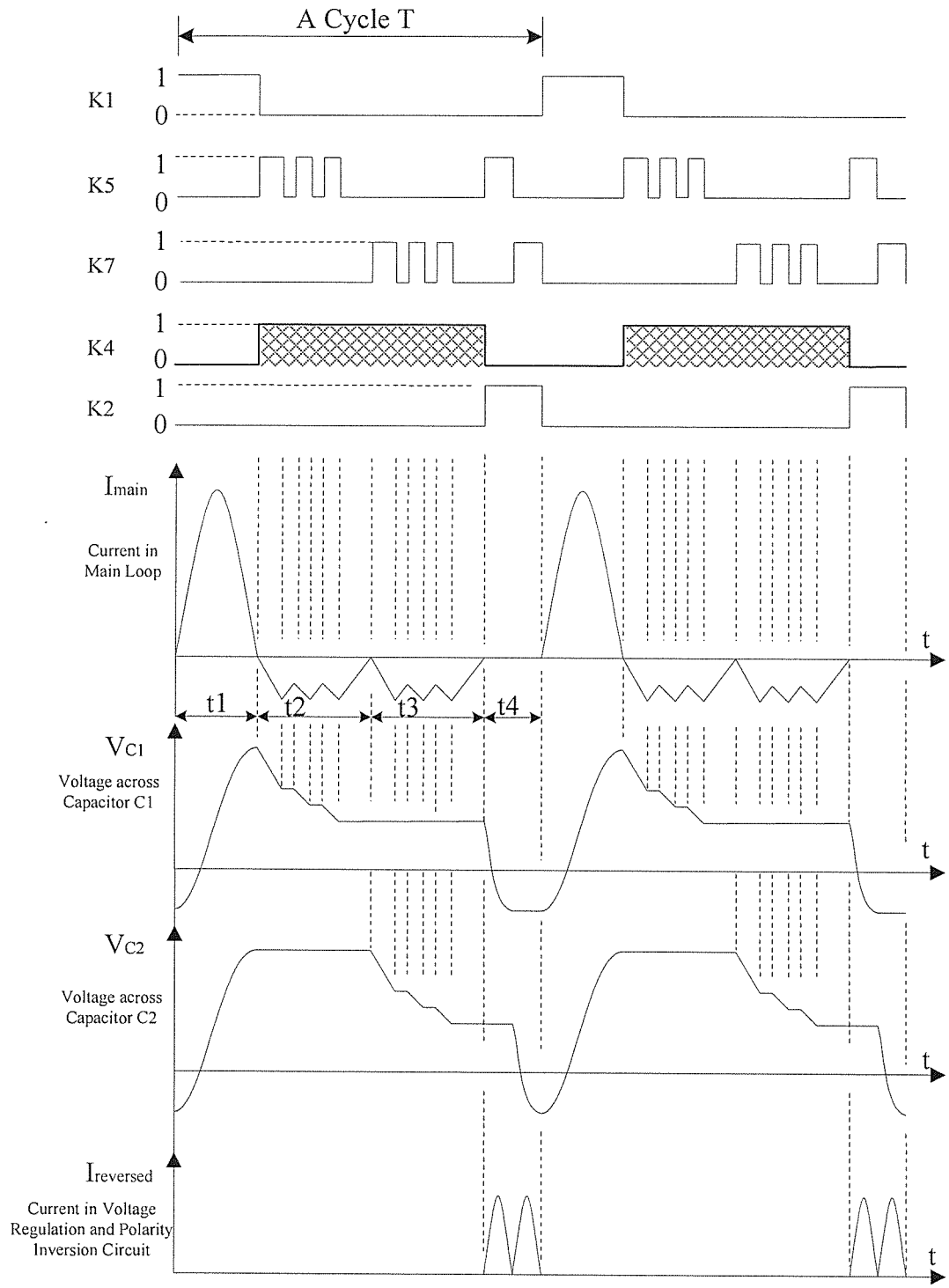
FIG. 7 is a timing diagram of waveforms of the battery heating circuit as shown in FIG. 6 according to one embodiment of the present invention.

FIG. 7 is a timing diagram of waveforms of the battery heating circuit as shown in FIG. 6 according to one embodiment of the present invention, wherein: the voltage $V_{C1}$ represents the voltage across the charge storage component C1, while the voltage $V_{C2}$ represents the voltage across a charge storage component C2. In one embodiment, the operation of the battery heating circuit in the third embodiment of the present invention is described below with reference to FIG. 7. The switching control module 100 controls the switch unit DK1 to switch on, and thus the electric energy in the battery E is charged into the charge storage components C1 and C2 (see the time period t1 in FIG. 7). When the current $I_{main}$ in the main loop reaches zero after the positive half cycle, the switch unit DK1 is controlled to switch off and the switch unit DK5 is controlled to switch on, so that the electric energy stored in the charge storage component C1 is charged back to the battery E via the current storage component L2; and during that period, to protect the battery from damaged by high back-charging current, the switch unit DK4 can be controlled to switch on and the switch unit DK5 can be controlled to switch on and off intermittently, to achieve the purpose of current limiting and freewheeling (see the time period t2 in FIG. 7). In the next time period t3, the switch unit DK7 can be controlled similarly to the switch unit DK5, so that the electric energy stored in the charge storage component C2 can be charged back to the battery E and the purpose of current limiting and freewheeling can be achieved. In the time period t4, the switching control module 100 controls the switch unit DK2 and the switch unit DK5 to switch on, to invert the voltage polarity of the charge storage component C1; and then, the switching control module 100 controls the switch unit DK5 to switch off and controls the switch unit DK7 to switch on, to accomplish voltage polarity inversion of the energy storage component C2. In another embodiment, the time periods t1-t4 constitute a complete cycle T; the cycle is repeated, to maintain the current flowing through the battery E, so as to achieve the purpose of self-heating of the battery.

It should be noted: the switch units mentioned in the above description can each be composed of a one-way semiconductor component and a switching component; for example, a switch unit DK3 is composed of a one-way semiconductor component D3 and a switching component K3. Here, the composition of the switch units DK4-DK7 is not further described. However, though the switch units as shown in the drawings each are composed of a one-way semiconductor component and a switching component, and each are one-way switches, those skilled in the art can envisage that two-way switches can also be used for the switch units to achieve certain purpose of the present invention, as long as the timing sequential control is appropriate (for example, the control can be exercises on the basis of the timing diagrams as shown in FIG. 2, FIG. 3, FIG. 5 and FIG. 7), according to certain embodiments. For example, the grid parts in the timing diagrams as shown in FIG. 2, FIG. 5 and FIG. 7 are only applicable to the case that the switch units each are composed of a one-way semiconductor component and a switching component; in such case, the ON/OFF control of the switching components in the switch units can be exercised according to the grid zones as shown in FIG. 2, FIG. 5 and FIG. 7.

In addition, in FIG. 6, the switch unit DK6 and the switch unit DK1 share the same switching component K1, to reduce the number of switching components. For example, the "first preset value of current" and "second preset value of current" mentioned above shall be set according to the current that can be tolerated by the battery E and other components/sub-units in the heating circuit, with comprehensive consideration of heating efficiency and protection of battery E against damages, as well as the size, weight and cost of the heating circuit. In another example, the "preset value of voltage" can be any expected voltage value.

Certain embodiments of the present invention has one or more of the following advantages: (1) The battery back-charging circuit and the voltage regulation and polarity inversion circuit share the same current storage component L2, and therefore the number of components can be reduced; (2) the voltage across the charge storage component C1 can be regulated to any value below the voltage of the battery E by controlling the switch unit DK2, to achieve flexible control of the voltage across the charge storage component C1; and (3) the energy load on the current storage component L2 can be alleviated by configuring the charge storage component C1 and arranging one or more charge storage components C2 in a configuration similar to the charge storage component C1, so that a current storage component L2 with lower capacity is enough to match the battery heating circuit provided in some embodiments of the present invention.

According to one embodiment, a battery heating circuit is provided, wherein: a battery E, a damping component R1, a current storage component L1, a switch unit DK1 and a charge storage component C1 are connected in series to form a battery discharging circuit; a current storage component L2 is connected with a one-way semiconductor component D3 in series, and then the series circuit composed of the current storage component L2 and the one-way semiconductor component D3 is connected in parallel to the ends of the switch unit DK1; the charge storage component C1, the current storage component L2 and the one-way semiconductor component D3 are connected in series in sequence to form a battery back-charging circuit; and a switch unit DK2 is connected in parallel to the ends of the serially connected charge storage component C1 and current storage component L2, and the switch unit DK2 works together with the current storage component L2 to form a voltage regulation and polarity inversion circuit for the charge storage component C1.

For example, wherein: the damping component R1 and the current storage component L1 are the parasitic resistance and inductance of the battery E respectively. In another example, wherein: the switch unit DK1 comprises a switching component K1 and a one-way semiconductor component D1 connected in series with each other, and the switch unit DK2 comprises a switching component K2 and a one-way semiconductor component D2 connected in series with each other.

In yet another example, wherein: the heating circuit further comprises a switching control module (100), which is electrically connected with the switch unit DK1 and the switch unit DK2, and the switching control module (100) is configured to: control the switch unit DK1 to switch on and control the switch unit DK2 to switch off, so that the electric energy in the battery E is charged into the charge storage component C1; in the process that the electric energy in the battery E is charged into the charge storage component C1, when the current flowing through the battery E reaches zero after the positive half cycle, control the switch unit DK1 to switch off, so that the electric energy stored in the charge storage component C1 is charged back to the battery E; in the process that the electric energy stored in the charge storage component C1 is charged back to the battery E, when the current flowing through the battery E reaches zero after the negative half cycle, control the switch unit DK2 to switch on, so that the electric energy stored in the charge storage component C1 is charged into the current storage component L2, and then the current storage component L2 charges the electric energy back to the charge storage component C1; and when the current flowing through the voltage regulation and polarity inversion circuit reaches zero after the positive half cycle, control the switch unit DK2 to switch off. In yet another example, wherein: the switching control module (100) is further configured to: when the current flowing through the voltage regulation and polarity inversion circuit reaches a first preset value of current, control the switch unit DK2 to switch off, so that the electric energy stored in the current storage component L2 flows to the battery E; and when the current flowing through the voltage regulation and polarity inversion circuit reaches a second preset value of current, control the switch unit DK2 to switch on, so that the electric energy stored in the charge storage component C1 is charged into the current storage component L2, wherein the second preset value of current is lower than the first preset value of current.

In yet another example, wherein: the heating circuit further comprises a switch unit DK4 and a switch unit DK5, the switch unit DK5 is in the path from the charge storage component C1 to the current storage component L2, the switch unit DK4 is connected in parallel to the ends of the charge storage component C1, so as to achieve current freewheeling function. In yet another example, wherein: the heating circuit further comprises a switching control module (100), which is electrically connected with the switch unit DK4 and the switch unit DK5, and the switching control module (100) is configured to: when the current flowing through the battery back-charging circuit reaches the first preset value of current, control the switch unit DK5 to switch off, and control the switch unit DK4 to switch on, so that the electric energy stored in the current storage component L2 is transferred to the battery E through the switch unit DK4; and when the current flowing through the battery back-charging circuit reaches the second preset value of current, control the switch unit DK4 to switch off, and control the switch unit DK5 to switch on, so that the electric energy stored in the charge storage component C1 is charged into the battery E through the current storage component L2; wherein the second preset value of current is lower than the first preset value of current. In yet another example, wherein: the heating circuit further comprises one or more charge storage components C2 and a switch unit DK6 and a switch unit DK7 corresponding to each charge storage component C2; the battery E, the damping component R1, the current storage component L1, the switch unit DK6 and the charge storage component C2 are connected in series to form another battery discharging circuit; the current storage component L2 and one-way semiconductor component D3 connected serially are connected in parallel to the ends of the switch unit DK6, so that the charge storage component C2, the current storage component L2 and the one-way semiconductor component D3 connected in series sequentially form another battery back-charging circuit, and the switch unit DK7 is in the path from the charge storage component C2 to the current storage component L2. In yet another example, wherein: the heating circuit further comprises a switching control module (100), which is electrically connected with the switch unit DK1, the switch unit DK2, the switch unit DK4, the switch unit DK5, the switch unit DK6 and the switch unit DK7, and the switching control module (100) is configured to control ON/OFF of the switch unit DK1, the switch unit DK2, the switch unit DK4, the switch unit DK5, the switch unit DK6 and the switch unit DK7, so that the charge storage component C2 and the charge storage component C1 are charged at the same time, but discharged and have polarity inversion at different times.

Certain embodiments of the present invention provide a battery heating circuit, wherein: a battery E, a damping component R1, a current storage component L1, a switch unit DK1 and a charge storage component C1 are connected in series to form a battery discharging circuit; a current storage component L2 is connected with a one-way semiconductor component D3 in series, and then the series circuit composed of the current storage component L2 and the one-way semiconductor component D3 is connected in parallel to the ends of the switch unit DK1; the charge storage component C1, the current storage component L2 and the one-way semiconductor component D3 are connected in series in sequence to form a battery back-charging circuit; and a switch unit DK2 is connected in parallel to the ends of the serially connected charge storage component C1 and current storage component L2, and works together with the current storage component L2 to form a voltage regulation and polarity inversion circuit for the charge storage component C1. In some embodiments of the present invention, the voltage across the charge storage component C1 can be regulated flexibly by controlling the switch unit DK2 in the voltage regulation and polarity inversion circuit.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A circuit for heating a battery, the circuit comprising:
the battery including a damping component and a first current storage component, the damping component and the first current storage component being parasitic to the battery;
a first switch unit;
a charge storage component, the charge storage component and the first switch unit being at least parts of a battery discharging circuit;
a second current storage component connected in series with the charge storage component;
a one-way semiconductor component connected in series with the second current storage component, the one-way semiconductor component and the second current storage component being connected in parallel with the first switch unit, the charge storage component, the second current storage component, and the one-way semiconductor component being parts of a battery charging circuit; and
a second switch unit connected in parallel to the charge storage component and the second current storage component, the second switch unit and the second current storage component being parts of a voltage regulation and polarity inversion circuit for the charge storage component;
wherein the circuit for heating the battery is configured to heat the battery by at least discharging the battery and charging the battery.

2. The circuit of claim 1 is further configured to:
start heating the battery if at least one heating start condition is satisfied; and
stop heating the battery if at least one heating stop condition is satisfied.

3. A circuit for heating a battery, the circuit comprising:
the battery including a damping component and a first current storage component, the damping component and the first current storage component being parasitic to the battery;
a first switch unit coupled to the battery;
a charge storage component coupled to the battery;
a second current storage component connected to the charge storage component;
a battery-charging one-way semiconductor component connected to the second current storage component, the second current storage component and the battery-charging one-way semiconductor component being in parallel with the first switch unit; and
a second switch unit connected to the charge storage component and the second current storage component;
wherein the circuit for heating the battery is configured to heat the battery by at least discharging the battery and charging the battery;
wherein the circuit for heating the battery is further configured to:
discharge the battery and charge the charge storage component through at least the first switch unit;
discharge the charge storage component and charge the battery through at least the second current storage component and the battery-charging one-way semiconductor component; and adjust a storage voltage associated with the charge storage component through at least the second current storage component and the second switch unit.

4. The circuit of claim 3 wherein the circuit for heating the battery is further configured to change a polarity of the storage voltage through at least the second current storage component and the second switch unit.

5. The circuit of claim 3 wherein:
the damping component includes a parasitic resistor of the battery; and
the first current storage component includes a parasitic inductor of the battery.

6. The circuit of claim 3 wherein:
the first switch unit includes a first switch and a first one-way semiconductor component connected in series with the first switch; and
the second switch unit includes a second switch and a second one-way semiconductor component connected in series with the second switch.

7. The circuit of claim 3, and further comprising:
a switching control component electrically coupled to at least the first switch unit and the second switch unit;
wherein the switching control component is configured to:
turn on the first switch unit and turn off the second switch unit in order to discharge the battery and charge the charge storage component using a first current; and
if the first current decreases to a first predetermined threshold in magnitude, turn off the first switch unit in order to discharge the charge storage component and charge the battery using a second current, with the second switch unit remaining off;
if the second current decreases to a second predetermined threshold in magnitude, turn on the second switch unit in order to adjust the storage voltage using a third current, with the first switch unit remaining off; and
if the third current decreases to a third predetermined threshold in magnitude, turn on the first switch unit and turn off the second switch unit in order to discharge the battery and charge the charge storage component.

8. The circuit of claim 7 wherein each of the first predetermined threshold, the second predetermined threshold, and the third predetermined threshold is equal to zero.

9. A circuit for heating a battery, the circuit comprising:
the battery including a damping component and a first current storage component, the damping component and the first current storage component being parasitic to the battery;
a first switch unit coupled to the battery;
a charge storage component coupled to the battery;
a second current storage component connected to the charge storage component;
a battery-charging one-way semiconductor component connected to the second current storage component, the second current storage component and the battery-charging one-way semiconductor component being in parallel with the first switch unit;
a second switch unit connected to the charge storage component and the second current storage component; and
a switching control component electrically coupled to at least the first switch unit and the second switch unit;
wherein the circuit for heating the battery is configured to heat the battery by at least discharging the battery and charging the battery;
wherein the circuit for heating the battery is further configured to:
discharge the battery and charge the charge storage component through at least the first switch unit;
discharge the charge storage component and charge the battery through at least the second current storage component and the battery-charging one-way semiconductor component; and
adjust a storage voltage associated with the charge storage component through at least the second current storage component and the second switch unit;
wherein the switching control component is configured to:
turn on the first switch unit and turn off the second switch unit in order to discharge the battery and charge the charge storage component using a first current; and
if the first current decreases to a first predetermined threshold in magnitude, turn off the first switch unit in order to discharge the charge storage component and charge the battery using a second current, with the second switch unit remaining off;
if the second current decreases to a second predetermined threshold in magnitude, turn on the second switch unit in order to adjust the storage voltage using a third current, with the first switch unit remaining off;
if the third current decreases to a third predetermined threshold in magnitude, turn on the first switch unit and turn off the second switch unit in order to discharge the battery and charge the charge storage component;
if the third current increases to a fourth predetermined threshold in magnitude, turn off the second switch unit in order to charge the battery from the second current storage component using a fourth current, with the first switch unit remaining off; and
if the fourth current decreases to a fifth predetermined threshold in magnitude, turn on the second switch unit;
wherein the fourth predetermined threshold is larger than the fifth predetermined threshold in magnitude.

10. A circuit for heating a battery, the circuit comprising:
the battery including a damping component and a first current storage component, the damping component and the first current storage component being parasitic to the battery:
a first switch unit coupled to the battery;
a first charge storage component coupled to the battery;
a second current storage component connected to the first charge storage component;
a battery-charging one-way semiconductor component connected to the second current storage component, the second current storage component and the battery-charging one-way semiconductor component being in parallel with the first switch unit;
a second switch unit connected to the first charge storage component and the second current storage component;
a third switch unit connected to the first charge storage component; and
a fourth switch unit connected to the third switch unit;
wherein the second current storage component is connected to the first charge storage component through at least the fourth switch unit;

wherein the circuit for heating the battery is configured to heat the battery by at least discharging the battery and charging the battery;

wherein the circuit for heating the battery is further configured to:
discharge the battery and charge the first charge storage component through at least the first switch unit;
discharge the first charge storage component and charge the battery through at least the second current storage component and the battery-charging one-way semiconductor component; and
adjust a storage voltage associated with the first charge storage component through at least the second current storage component and the second switch unit.

11. The circuit of claim 10, and further comprising:
a switching control component electrically coupled to at least the first switch unit, the second switch unit, the third switch unit, and the fourth switch unit;
wherein the switching control component is configured to:
turn on the first switch unit and turn off the second switch unit, the third switch unit, and the fourth switch unit, in order to discharge the battery and charge the first charge storage component using a first current;
if the first current decreases to a first predetermined threshold in magnitude, turn off the first switch unit and turn on the fourth switch unit in order to discharge the first charge storage component and charge the battery using a second current, with the second switch unit and the third switch unit remaining off;
if the second current increases to a second predetermined threshold in magnitude, turn on the third switch unit and turn off the fourth switch unit in order to charge the battery from the second current storage component using a third current, with the first switch unit and the second switch unit remaining off; and
if the third current decreases to a third predetermined threshold in magnitude, turn off the third switch unit and turn on the fourth switch unit, with the first switch unit and the second switch unit remaining off; and
wherein the second predetermined threshold is larger than the third predetermined threshold in magnitude.

12. The circuit of claim 11 wherein the first predetermined threshold is equal to zero.

13. The circuit of claim 10, and further comprising:
one or more fifth switch units coupled to the battery;
one or more sixth switch units; and
one or more second charge storage components coupled to the battery and connected to the second current storage component through the one or more sixth switch units respectively;
wherein each of the one or more second charge storage components corresponds to one of the one or more fifth switch units and one of the one or more sixth switch units;
wherein the circuit for heating the battery is further configured to:
discharge the battery and charge each of the one or more second charge storage components through at least one of the one or more fifth switch units; and
discharge each of the one or more second charge storage components and charge the battery through at least one of the one or more sixth switch units, the second current storage component, and the battery-charging one-way semiconductor component.

14. The circuit of claim 13 wherein:
the first switch unit includes a first switch and a first one-way semiconductor component connected in series with the first switch; and
each of the one or more fifth switch units includes the first switch and a corresponding one-way semiconductor component connected in series with the first switch.

15. The circuit of claim 13, and further comprising a switching control component electrically coupled to the one or more fifth switch units and the one or more sixth switch units and configured to turn on or off, individually, the first switch unit, the second switch unit, the third switch unit, the fourth switch unit, the one or more fifth switch units, and the one or more sixth switch units.

16. The circuit of claim 15 is further configured to:
charge the first charge storage component and the one or more second charge storage components at the same time; and
discharge the first charge storage component and the one or more second charge storage components at different times, respectively.

17. A circuit for heating a battery, the circuit comprising:
the battery including a resistor and a first inductor, the resistor and the first inductor being parasitic to the battery;
a first switch unit coupled to the battery;
a capacitor coupled to the battery;
a second inductor connected to the capacitor;
a battery-charging diode connected to the second inductor, the second inductor and the battery-charging diode being in parallel with the first switch unit; and
a second switch unit connected to the capacitor and the second inductor;
wherein the circuit for heating the battery is configured to heat the battery by at least discharging the battery and charging the battery;
wherein the circuit for heating the battery is further configured to:
discharge the battery and charge the capacitor through at least the first switch unit;
discharge the capacitor and charge the battery through at least the second inductor and the battery-charging diode; and
adjust a capacitor voltage associated with the capacitor through at least the second inductor and the second switch unit.

18. The circuit of claim 17 wherein:
the first switch unit includes a first switch and a first diode connected in series with the first switch; and
the second switch unit includes a second switch and a second diode connected in series with the second switch.

19. The circuit of claim 18 wherein the first switch includes a MOSFET.

20. A circuit for heating a battery, the circuit comprising:
the battery including a resistor and a first inductor, the resistor and the first inductor being parasitic to the battery;
a first switch unit coupled to the battery;
a capacitor coupled to the battery;
a second inductor connected to the capacitor;
a battery-charging diode connected to the second inductor, the second inductor and the battery-charging diode being in parallel with the first switch unit; and
a second switch unit connected to the capacitor and the second inductor;

wherein the circuit for heating the battery is configured to heat the battery by at least discharging the battery and charging the battery;

wherein the circuit for heating the battery is further configured to:

discharge the battery and charge the capacitor through at least the first switch unit;

discharge the capacitor and charge the battery through at least the second inductor and the battery-charging diode; and adjust a capacitor voltage associated with the capacitor through at least the second inductor and the second switch unit;

wherein the first switch unit includes a first switch and a first diode connected in series with the first switch;

wherein the second switch unit includes a second switch and a second diode connected in series with the second switch; and wherein the first switch includes an IGBT and a third diode coupled to the IGBT.

* * * * *